United States Patent

[11] 3,564,109

[72] Inventor Hugo Ruechardt
Gauting, Germany
[21] Appl. No. 754,085
[22] Filed Aug. 20, 1968
[45] Patented Feb. 16, 1971
[73] Assignee Siemens Aktiengesellschaft
Berlin, Germany
[32] Priority Aug. 24, 1967
[33] Germany
[31] 111,507

[54] SEMICONDUCTOR DEVICE WITH HOUSING
2 Claims, 3 Drawing Figs.

[52] U.S. Cl. ........ 174/15; 317/234
[51] Int. Cl. ........ H01l 1/12
[50] Field of Search ........ 174/15, 16, HS, 52.6; 317/100, 234.1, 235

[56] References Cited

UNITED STATES PATENTS 2,758,261 8/1956 Armstrong et al. ........ 317/234
2,763,822 9/1956 Frola et al. ........ 317/234
2,850,687 9/1958 Hammes ........ 317/235
3,035,419 5/1962 Wigert ........ 174/115X
3,264,248 8/1966 Lee ........ 174/52X
3,390,226 6/1968 Beyerlein ........ 174/52
3,317,796 5/1967 Thompson ........ 317/100

OTHER REFERENCES

INSULATING MATERIALS FOR DESIGN AND ENGINEERING PRACTIC pp 663— 666 TK 3421 c56 c.2

*Primary Examiner*—Lewis H. Myers
*Assistant Examiner*—A. T. Grimley
*Attorneys*—Curt M. Avery, Arthur E. Wilfond, Herbert L. Lerner and Daniel J. Tick

ABSTRACT: The present invention relates to a semiconductor device with housing and with a cooling device particularly cooling ribs provided at the housing wall. The invention is characterized by the fact that the cooling device and the adjacent housing portion are comprised of a single piece of heat-conducting synthetic material. The technical progress derived from the invention is realized to a particularly full extent if the cooling device and the adjacent housing portion are produced in a single work process by injection molding.

SEMICONDUCTOR DEVICE WITH HOUSING

To lower production costs, synthetic housings have been used for semiconductor devices. This is primarily possible in that the semiconductor surface, at least at the PN junctions, is provided with a tightly sealing protective layer comprised for example, of insulating $SiO_2$ or $Si_3N_4$. Thus the synthetic housing may find acceptance in connection with high quality semiconductor devices.

In one area, however, it appears absolutely necessary to have a housing of a metal or a good heat insulating ceramic. That area is where the housing is on a semiconductor device which develops a considerable degree of heat.

The present invention is based on the recognition that synthetic materials can also be used in such instances. A hot conductor device for controlling the temperature of the liquid bath is already known wherein the hot conductor body is arranged at the inside of the front face of a sleeve comprised of synthetic material.

The present invention relates to a semiconductor device with housing and with a cooling device, particularly cooling ribs provided at the housing wall. The invention is characterized by the fact that the cooling device and the adjacent housing portion are comprised of a single piece of heat-conducting synthetic material. The technical progress derived from the invention is realized to a particularly full extent if the cooling device and the adjacent housing portion are produced in a single work process by injection molding.

In addition to the preferred embodiment of the cooling device as cooling ribs or other projections which enlarge the surface of the housing relative to its volume, it is also possible in connection with a device of the invention, to design the cooling device as tubular ducts, ditches or other guides which contain a stationary or flowing coolant.

Injection molding of synthetic materials or plastics, which is now possible for enclosing and encapsulation of semiconductor components permits a very wide selection of shapes for the synthetic housing. The slopes are only limited by the difficulties occurring in loosening the enveloped component from the mold and by the necessity of adequate mechanical stability. Relatively complicated structures can, therefore, be produced of castable synthetic material of which we can name, as an example, polyester resins, araldit, epoxide resin and silicons and polypropylenes. Such synthetics can furthermore be considerably compounded with substantial amounts of inorganic filling materials, such as quartz meal, aluminum oxide particles, BeO particles and metal particles. The metal content can, if necessary, exceed the share of synthetic material, with respect to weight and volume.

It is an object of the present invention to effect the shaping of the injection molds and, thus, also of the synthetic housing in such a manner that the housing surface is increased to provide the best possible heat transfer to the surrounding. Thus, cooling ribs or appropriately shaped cooling surfaces should be included into the housing form. Also, the formation of ducts or bores for a flow through of liquid or gaseous cooling substances may be incorporated into the synthetic housing in the same manner, through an appropriate shaping of the original injection molding form.

It is understood that the wall thickness is as small as possible. This also applies when the semiconductor device is kept in direct contact with the synthetic envelope. It suffices if the wall thickness minimum does not exceed 1 mm. at this location. Moreover, it is recommendable to arrange the cooling device directly at this point.

The drawings show various embodiments, in form of examples:

Figure 1:
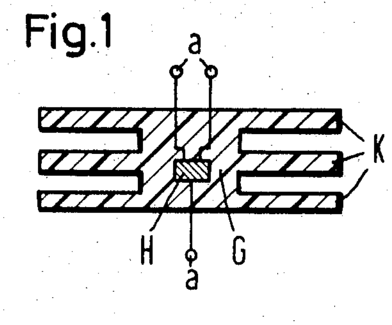
FIGS. 1 and 3 show the cooling means as cooling ribs.
Figure 2:
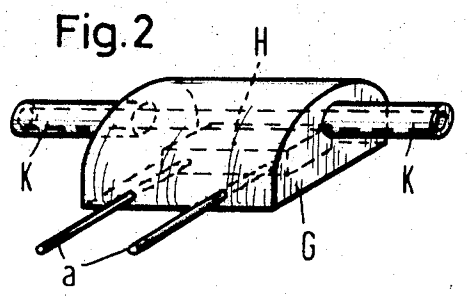
FIG. 2 shows a duct which can be passed by a liquid coolant.
Figure 3:
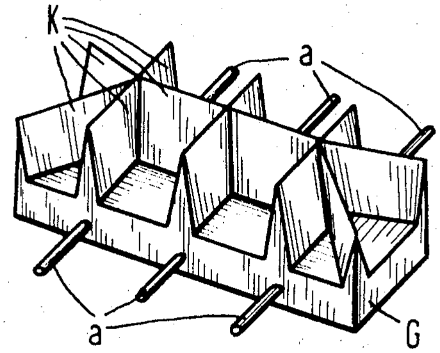

Of the reference characters shown, *a* denotes the electrical connections, which together with the semiconductors can, if necessary, be insulated by an insulating coating comprised, e.g. another synthetic material, varnish, glass, enamel, inside the synthetic wrapping against the synthetic material of the casing if the latter has poor electric insulation properties due to certain filling materials. H indicates the semiconductor component, G the wall of the synthetic housing and K the measures applied for cooling.

I claim:

1. A semiconductor device with an adjacent wrapping comprising heat conducting synthetic material consisting of one piece with the cooling ribs comprising the same material, the surface portion of the wrapping which carries the cooling ribs is separated in some places from the semiconductor device, by a maximum of 1 mm.

2. The semiconductor device of claim 1, wherein the wrapping is provided with a duct to be transversed by a fluid coolant, said duct being removed from the semiconductor device by a maximum of 1 mm.